United States Patent
Fujino

[11] Patent Number: 5,879,824
[45] Date of Patent: Mar. 9, 1999

[54] MAGNETOSTATIC WAVE DEVICE AND MATERIAL FOR THE SAME

[75] Inventor: Masaru Fujino, Shiga-ken, Japan

[73] Assignee: Murata Manufacturing Co., Ltd., Japan

[21] Appl. No.: 638,700

[22] Filed: Apr. 26, 1996

[30] Foreign Application Priority Data

May 10, 1995 [JP] Japan .................................. 7-111625

[51] Int. Cl.$^6$ ...................................................... B32C 9/04
[52] U.S. Cl. .................. 428/699; 428/697; 428/928; 252/62.57; 252/62.59; 252/62.63; 359/280; 359/282; 385/1; 385/6; 385/130
[58] Field of Search ................. 428/697, 699, 428/928; 252/62.57, 62.59, 62.63; 148/301, 324, 304; 359/280, 282; 385/1, 6, 130

[56] References Cited

U.S. PATENT DOCUMENTS

| | | | |
|---|---|---|---|
| 3,006,854 | 10/1961 | Geller | 252/62.5 |
| 3,838,450 | 9/1974 | Bongers et al. | 360/59 |
| 4,183,999 | 1/1980 | Ota et al. | 428/336 |
| 4,337,521 | 6/1982 | Blank et al. | 365/33 |
| 4,721,547 | 1/1988 | Nomura et al. | 156/603 |
| 4,896,103 | 1/1990 | Shimanuki et al. | 324/96 |
| 4,968,954 | 11/1990 | Ryuo et al. | 331/107 A |
| 5,198,297 | 3/1993 | Tanno et al. | 428/336 |
| 5,466,388 | 11/1995 | Fujii et al. | 252/62.59 |
| 5,601,935 | 2/1997 | Fujino et al. | 428/692 |
| 5,608,570 | 3/1997 | Brandle, Jr. et al. | 359/321 |

FOREIGN PATENT DOCUMENTS

| | | | |
|---|---|---|---|
| 6-318517 | 11/1994 | Japan | H01F 10/24 |
| 2243152 | 10/1991 | United Kingdom | C04B 35/26 |

OTHER PUBLICATIONS

S.D. Silliman et al., "Improvement of FMR linewidth in Bi-substituted lutetium iron garnet this films for the MSW-optical-mode interaction", Journal of Applied Physics, vol. 73, No. 10, May 15, 1993, pp. 6460–6462.

Patent Abstracts of Japan, vol. 005, No. 015 (E–043), Jan. 29, 1981 and JP–A–55 143009 (Matsushita Electric Ind. Co. Ltd.), Nov. 8, 1980.

*Primary Examiner*—Nam Nguyen
*Assistant Examiner*—Steven H. Ver Steeg
*Attorney, Agent, or Firm*—Ostrolenk, Faber, Gerb & Soffen, LLP

[57] ABSTRACT

A magnetostatic wave device comprising a magnetic garnet single crystalline film having a general formula of $R_{3-x}Ca_xMa_{5-2y+x}Zr_yMb_{y-x}O_{12}$ wherein R is at least one of Y, La, Bi, Gd, Lu and Sc, and Ma is at least one of Fe, Ga and Al, while Fe is present as an essential component, and Mb is at least one of Mg and Mn, and wherein the conditions of $0 \leq x \leq 1$, $0.1 \leq y \leq 1$, and $x \leq y$ are satisfied.

14 Claims, 1 Drawing Sheet

MAGNETOSTATIC WAVE DEVICE AND MATERIAL FOR THE SAME

BACKGROUND OF THE INVENTION

1. Field of the Invention

The present invention relates to a magnetostatic wave device and a material for use in the same.

2. Description of the Related Art

Magnetic garnet single crystals containing Fe has been used as materials for magnetostatic wave devices. In particular, a single crystal of $Y_3Fe_5O_{12}$ (hereinafter referred to simply as "YIG") has a narrow ferromagnetic half-value width ($\Delta H$), which allows the difference between the input signal and the output signal to be small when the YIG is used in a magnetostatic wave device. As a result, YIG has been widely used.

That type of garnet single crystal is obtained as a film epitaxially grown on a substrate such as $Ga_3Gd_5O_{12}$ (hereinafter referred to simply as "GGG") by, for example, a liquid phase epitaxial growth process.

A magnetostatic wave device using a YIG single crystal operates at a frequency of about 2 GHz. However, in the case where a magnetostatic wave device is employed in a noise filter used in a broadcast satellite (BS) tuner, the magnetostatic wave device is required to operate at a frequency in the range of from several hundreds MHz to several hundred thousands MHz.

When the magnetostatic forward volume wave (MSFVW) mode is selected in the magnetostatic wave (MSW) mode, the operating frequency of the device is expressed by eq.(1).

$$\omega = \gamma(H_{ex} - N \cdot 4\pi Ms) \tag{1}$$

where $\omega$: frequency $\gamma$: gyromagnetic ratio $H_{ex}$: applied magnetic field N: demagnetization coefficient $4\pi Ms$: saturation magnetization When the magnetostatic surface wave (MSSW) mode is used, the operating frequency of the device is expressed by eqs.(2) and (3).

$$\omega = \gamma\{H_i(H_i + 4\pi Ms)\}^{1/2} \tag{2}$$

$$H_i = H_{ex} - N \cdot 4\pi Ms + H_a \tag{3}$$

where $H_i$: internal magnetic field $H_{ex}$: applied magnetic field

N: demagnetization coefficient $4\pi Ms$: saturation magnetization $H_a$: anisotropic magnetic field Accordingly, the external magnetic field or the saturation magnetization needs to be decreased in order to decrease the operating frequency of a magnetostatic wave device.

SUMMARY OF THE INVENTION

It is therefore an object of the present invention to provide a magnetostatic wave device which can operate at a lower frequency, for example, at a frequency in the range of several hundreds MHz to several hundred thousands MHz and a material for use in the same.

The magnetostatic wave device of the present invention comprises a magnetic garnet single crystalline film having a general formula of $R_{3-x}Ca_xMa_{5-2y+x}Zr_yMb_{y-x}O_{12}$, wherein R is at least one of Y, La, Bi, Gd, Lu and Sc, and Ma is at least one of Fe, Ga and Al, while Fe is present as an essential component, and Mb is at least one of Mg and Mn, and wherein the conditions of $0 \leq x \leq 1$, $0.1 \leq y \leq 1$, and $x \leq y$ are satisfied.

In one embodiment, the magnetic garnet single crystalline film is formed on a substrate of any one of $Gd_3Ga_5O_{12}$, $Sm_3Ga_5O_{12}$, and $Nd_3Ga_5O_{12}$ substrates.

By specifying the composition of the magnetic garnet single crystalline film as described above, a magnetic garnet single crystalline film with a small saturation magnetization value and a small ferromagnetic half-value width value is obtained. Moreover, the magnetic garnet single crystalline film having a small saturation magnetization value and a ferromagnetic half-value width is obtained by forming it on any GGG substrate, $Sm_3Ga_5O_{12}$ (hereinafter referred to simply as "SGG"), and $Nd_3Ga_5O_{12}$ (hereinafter referred to simply as "NGG") substrates.

Consequently, a magnetostatic wave device capable of operating at a lower frequency, or which has a lower pass-band than that of a device using a conventional magnetic garnet film is obtained by using the magnetic garnet single crystalline film.

DETAILED DESCRIPTION OF THE INVENTION

Figure 1:
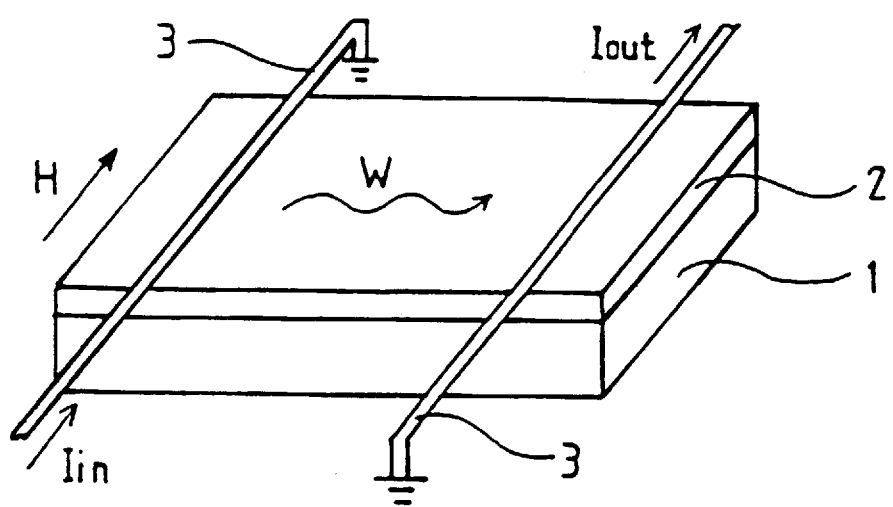
FIG. 1 is a perspective view of a noise filter according to one embodiment of the present invention.

The magnetostatic wave device of the present invention is further described in the following with reference to the embodiments in which the liquid phase epitaxial growth process is applied to form a magnetic garnet single crystalline film and to fabricate a magnetostatic wave device using a thus-formed film.

EXAMPLE 1

A GGG ($Gd_3Ga_5O_{12}$) substrate was prepared as the substrate for forming a garnet single crystalline film thereon. As the starting materials of the garnet single crystalline film, $Fe_2O_3$, $Y_2O_3$, $CaCO_3$, $Sc_2O_3$, $Lu_2O_3$, $Ga_2O_3$, $Al_2O_3$, $ZrO_2$, MnO and MgO were prepared. These starting materials were mixed with PbO and $B_2O_3$ as the solvent to obtain the garnet single crystals having compositions listed in Table 1. Each of these prepared single crystals was placed in a platinum crucible, and was soaked at about 1200° C. to obtain a melt.

In Table 1, the single crystals marked with an asterisk (*) are the ones outside of the scope of the present invention.

TABLE 1

| Sample No. | Composition | 4πMs (G) | ΔH (Oe) | Latice constant (Angstroms) | Operating frequency of magnetostatic wave device (MHz) |
|---|---|---|---|---|---|
| *1 | $Y_3Fe_5O_{12}$ | 1740 | 0.5 | 12.376 | 1900 |
| *2 | $Y_3Fe_{4.98}Zr_{0.01}Mg_{0.01}O_{12}$ | 1700 | 0.6 | 12.379 | 1800 |
| 3 | $Y_{2.7}Lu_{0.3}Fe_{4.8}Zr_{0.1}Mg_{0.1}O_{12}$ | 1340 | 0.8 | 12.380 | 1300 |
| 4 | $Y_{0.2}Lu_{2.8}Fe_3ZrMgO_{12}$ | 370 | 1.0 | 12.377 | 400 |
| *5 | $Y_{0.2}Lu_{2.8}Fe_{2.8}Zr_{1.1}Mg_{1.1}O_{12}$ | 350 | 4.2 | 12.385 | — |
| *6 | $Y_{2.99}Ca_{0.01}Fe_{4.99}Zr_{0.01}O_{12}$ | 1720 | 0.6 | 12.380 | 1800 |
| 7 | $Y_{2.8}Sc_{0.1}Ca_{0.1}Fe_{4.9}Zr_{0.1}O_{12}$ | 1460 | 0.7 | 12.383 | 1500 |
| 8 | $Y_{0.8}Sc_{1.2}CaFe_4ZrO_{12}$ | 590 | 0.9 | 12.378 | 600 |
| *9 | $Y_{0.6}Sc_{1.3}Ca_{1.1}Fe_{3.9}Zr_{1.1}O_{12}$ | 510 | 3.5 | 12.387 | — |
| *10 | $Y_{2.995}Ca_{0.005}Fe_{4.985}Zr_{0.01}Mg_{0.005}O_{12}$ | 1710 | 0.7 | 12.380 | 1800 |
| 11 | $Y_{2.6}Lu_{0.35}Ca_{0.05}Fe_{4.85}Zr_{0.1}Mg_{0.05}O_{12}$ | 1400 | 0.8 | 12.381 | 1500 |
| 12 | $Y_{0.1}Lu_{2.4}Ca_{0.5}Fe_{2.5}GaZrMg_{0.5}O_{12}$ | 460 | 0.9 | 12.386 | 500 |
| *13 | $Y_{0.05}Lu_{2.4}Ca_{0.55}Fe_{2.35}GaZr_{1.1}Mg_{0.55}O_{12}$ | 420 | 4.4 | 12.390 | — |
| *14 | $Y_{2.995}Ca_{0.005}Fe_{4.985}Zr_{0.01}Mn_{0.005}O_{12}$ | 1710 | 0.6 | 12.379 | 1800 |
| 15 | $Y_{2.6}Lu_{0.35}Ca_{0.05}Fe_{4.85}Zr_{0.1}Mn_{0.05}O_{12}$ | 1420 | 0.8 | 12.380 | 1500 |
| 16 | $Y_{0.1}Lu_{2.4}Ca_{0.5}Fe_{2.5}AlZrMn_{0.5}O_{12}$ | 500 | 0.9 | 12.385 | 600 |
| *17 | $Y_{0.05}Lu_{2.4}Ca_{0.55}Fe_{2.35}AlZr_{1.1}Mn_{0.55}O_{12}$ | 480 | 4.1 | 12.389 | — |
| *18 | $Y_{2.99}Ca_{0.01}Fe_{4.97}Zr_{0.02}Mg_{0.005}Mn_{0.005}O_{12}$ | 1700 | 0.7 | 12.380 | 1800 |
| 19 | $Y_{2.6}Lu_{0.35}Ca_{0.05}Fe_{4.85}Zr_{0.1}Mg_{0.02}Mn_{0.03}O_{12}$ | 1410 | 0.8 | 12.381 | 1500 |
| 20 | $Y_{0.1}Lu_{2.4}Ca_{0.5}Fe_{2.5}GaZrMg_{0.4}Mn_{0.1}O_{12}$ | 490 | 0.9 | 12.387 | 500 |
| *21 | $Lu_{2.45}Ca_{0.55}Fe_{2.35}GaZr_{1.1}Mg_{0.35}Mn_{0.2}O_{12}$ | 430 | 3.8 | 12.390 | 500 |
| *22 | $Y_{1.1}Lu_{0.8}Ca_{1.1}Fe_{4.7}Zr_{0.3}O_{11.6}$ | 1290 | 7.9 | 12.384 | — |

The thus-prepared garnet starting material melt was held at a constant temperature of around 900° C. to bring it to a super-saturation state. The GGG substrate was immersed into the melt while rotating to allow growth for a specified period. Then the substrate was pulled up from the melt, and the substrate was rotated at a high speed to remove the attached melt from the garnet single crystalline film by centrifugal force to obtain the garnet single crystalline film.

The obtained garnet single crystalline film was analyzed to determine the saturation magnetization (4πMs) and ferromagnetic half-value width (ΔH) using an electron spin response (ESR) device. X-ray diffractometry was also applied to determine the latice constant. The results are shown in Table 1.

FIG. 1 shows a noise filter, which is one example of magnetostatic wave device according to a preferred embodiment of the present invention. The noise filter includes a GGG substrate 1 and a garnet single crystalline film 2 provided on the GGG substrate 1. The garnet single crystalline film 2 can be prepared according to the method explained above. The noise filter further includes a pair of electrodes 3 provided on the garnet single crystalline film 2. The filter characteristic was measured to determine the operating frequency. The results are also shown in Table 1. A (-) mark in the operating frequency value of magnetostatic wave device indicates that the input power loss of the composition increased when the composition was used to fabricate a magnetostatic wave device and that the device did not have filter characteristics.

In FIG. 1, reference symbol H denotes the direction of the applied external magnetic field during the determination of filter characteristic, Iin denotes the direction of entering the microwave, W denotes the direction of the propagation of magnetostatic surface wave (MSSW), and Iout denotes the direction of the generation of the microwave.

As seen in Table 1, the garnet single crystalline films within the scope of the present invention gave a smaller 4πMs value in range from 1460 to 370G, and similar value of ΔH compared with the YIG single crystalline film of conventional material given in sample No. 1. Accordingly, the operating frequency of the formed magnetostatic wave device can be reduced to a range of from 400 to 1500 MHz while keeping the ΔH at almost the same value of the conventional YIG single crystalline film.

On the contrary, when the value of Ca, i.e., the value of x, exceeds about 1.0, as seen in sample No. 22, the value of ΔH significantly increases, and the fabricated magnetostatic wave device does not show filter characteristics.

As shown in sample Nos. 2, 6, 10, 14, and 18, when the value of Zr, i.e., the value of y, is below about 0.1, the value of 4πMs becomes almost equal to the case of YIG, which is not preferable. On the other hand, when the value of Zr, i.e., y, exceeds about 1.0 as seen in sample Nos. 5, 9, 13, 17, and 21, the value of ΔH becomes 3.5 Oe or more, and the fabricated magnetostatic wave device increases the input power loss and does not show filter characteristics. Thus the material cannot be used as a magnetostatic wave device.

EXAMPLE 2

An NGG ($Nd_3Ga_5O_{12}$) substrate was prepared as the substrate for forming a garnet single crystalline film thereon. As the starting materials of garnet single crystalline film, $Fe_2O_3$, $Y_2O_3$, $Gd_2O_3$, $Lu_2O_3$, $ZrO_2$, MnO and MgO were prepared. These starting materials were mixed with PbO and $B_2O_3$ as the solvent to obtain garnet single crystals having the compositions listed in Table 2. Each of these prepared single crystals was placed in a platinum crucible which was held in a vertical electric furnace, and was soaked at about 1200° C. to obtain a melt.

The thus prepared garnet starting material melt was kept at a constant temperature of around 900° C. to bring it to a super-saturation state. The NGG substrate was immersed while rotating into the melt to make it grow for a specified period. Then the substrate was pulled up from the melt, and the substrate was rotated at a high speed to remove the attached melt from the garnet single crystalline film by centrifugal force to obtain the garnet single crystalline film.

In Table 2, the single crystals marked with an asterisk (*) are the ones outside of the scope of the present invention.

TABLE 2

| Sample No. | Composition | $4\pi Ms$ (G) | $\Delta H$ (Oe) | Latice constant (angstrom) | Operating frequency of magnetiosatic wave device (MHz) |
|---|---|---|---|---|---|
| *23 | $Y_{0.2}Gd_{2.8}Fe_{4.98}Zr_{0.01}Mg_{0.005}Mn_{0.005}O_{12}$ | 1710 | 0.7 | 12.500 | 1800 |
| 24 | $YGd_2Fe_{4.8}Zr_{0.1}Mg_{0.05}Mn_{0.05}O_{12}$ | 1410 | 0.8 | 12.502 | 1500 |
| 25 | $Y_{2.5}Lu_{0.5}Fe_3ZrMg_{0.6}Mn_{0.4}O_{12}$ | 500 | 1.0 | 12.514 | 600 |
| *26 | $Y_{2.5}Lu_{0.5}Fe_{2.8}Zr_{1.1}Mg_{0.6}Mn_{0.5}O_{12}$ | 480 | 4.4 | 12.515 | — |

The obtained garnet single crystalline film was analyzed to determine the saturation magnetization ($4\pi Ms$), ferromagnetic half-value width ($\Delta H$), and the lattice constant using the same procedure as in Example 1. The results are shown in Table 2.

Similar to Example 1, a noise filter was fabricated using the obtained garnet single crystalline film. The filter characteristic was measured to determine the operating frequency. The results are shown in Table 2. A (-) mark in the operating frequency value of magnetostatic wave device indicates that the input power loss of the composition increased when the composition was used to fabricate a magnetostatic wave device and that the device did not give filter characteristics.

As seen in Table 2, the garnet single crystalline films within the scope of the present invention gave smaller value of $4\pi Ms$ ranging from 500 to 1410G, and similar value of $\Delta H$ as the YIG single crystalline film of conventional material (refer to the sample No.1 of Example 1). Accordingly, the operating frequency of formed magnetostatic wave device can be reduced to a range of from 600 to 1500 MHz.

To the contrary, when the value of Zr, that is the value of y, is below about 0.1 as in sample No. 23, the value of $4\pi Ms$ becomes almost equal to the case of YIG, which is not preferable. On the other hand, when the value of Zr, i.e., y, exceeds about 1.0 as seen in sample No. 26, the value of $\Delta H$ becomes 4.0 Oe or more, and does not show filter characteristics. Thus the material cannot be used as a magnetostatic wave device.

EXAMPLE 3

An SGG ($Sm_3Ga_5O_{12}$) substrate was prepared as the substrate on which to form a garnet single crystalline film thereon. As the raw materials of the garnet single crystalline film, $Fe_2O_3$, $Y_2O_3$, $Bi_2O_3$, $La_2O_3$, $Lu_2O_3$, $ZrO_2$, MnO and MgO were prepared. These raw materials were mixed with PbO and $B_2O_3$ as the solvent to obtain garnet single crystals having the compositions listed in Table 3. Each of these prepared single crystals was placed in a platinum crucible which was held in a vertical electric furnace, and was soaked at about 1200° C. to obtain a melt.

In Table 3, the single crystals marked with an asterisk (*) are the outside of the scope of the present invention.

TABLE 3

| Sample No. | Composition | $4\pi Ms$ (G) | $\Delta H$ (Oe) | Latice constant (A) | Operating frequency of magnetiosatic wave device (MHz) |
|---|---|---|---|---|---|
| *27 | $Y_{0.6}La_{2.4}Fe_{4.98}Zr_{0.01}Mn_{0.01}O_{12}$ | 1700 | 0.7 | 12.430 | 1800 |
| 28 | $Y_{2.9}La_{0.1}Fe_{4.8}Zr_{0.1}Mn_{0.1}O_{12}$ | 1400 | 0.8 | 12.438 | 1500 |
| 29 | $YLu_2Fe_3ZrMnO_{12}$ | 480 | 0.9 | 12.444 | 600 |
| *30 | $YLu_2Fe_{2.8}Zr_{1.1}Mn_{1.1}O_{12}$ | 430 | 4.1 | 12.449 | — |
| *31 | $Y_{0.4}Bi_{2.6}Fe_{4.98}Zr_{0.01}Mn_{0.01}O_{12}$ | 1710 | 0.8 | 12.434 | 1800 |
| 32 | $Y_{2.9}Bi_{0.1}Fe_{4.8}Zr_{0.1}Mn_{0.1}O_{12}$ | 1390 | 0.8 | 12.435 | 1500 |
| 33 | $YLu_2Fe_3ZrMgO_{12}$ | 510 | 0.9 | 12.445 | 600 |
| *34 | $YLu_2Fe_{2.8}Zr_{1.1}Mg_{1.1}O_{12}$ | 430 | 4.0 | 12.449 | — |

The thus-prepared garnet starting material melt was held at a constant temperature of around 900° C. to bring it to a super-saturation state. The SGG substrate was immersed while rotating into the melt to perform growth for a specified period. Then the substrate was pulled up from the melt, and the substrate was rotated at a high speed to remove the attached melt from the garnet single crystalline film by the use of centrifugal force to obtain the garnet single crystalline film.

The obtained garnet single crystalline film was analyzed to determine the saturation magnetization ($4\pi Ms$), the ferromagnetic half band width ($\Delta H$), and the latice constant using the same procedure as in Example 1. The results are shown in Table 3.

Similar to Example 1, a noise filter was fabricated using the obtained garnet single crystalline film. The filter characteristic was measured to determine the operating frequency. The results are shown in Table 3. A (-) mark in the operating frequency value of magnetostatic wave device indicates that the input power loss of the composition increased when the composition was used to fabricate a magnetostatic wave device and that the device did not exhibit a filter characteristics.

As seen in Table 3, the garnet single crystalline films within the scope of the present invention gave a smaller value of 4πMs ranging from 480 to 1400G, and similar value of ΔH with the YIG single crystalline film of conventional material (refer to the sample No.1 of Example 1). Accordingly, the operating frequency of formed magnetostatic wave device can be reduced to a range of from 600 to 1500 MHz.

On the contrary, when the value of Zr, i.e., the value of y, is below about 0.1 as in sample Nos. 27 and 31, the value of 4πMs becomes almost equal to the case of YIG, which is not preferable. On the other hand, when the value of Zr, that is y, exceeds about 1.0 as seen in sample Nos. 30 and 34, the value of ΔH becomes 4.0 Oe or more, and does not exhibit a filter characteristic. Thus the material cannot be used as a magnetostatic wave device.

The above-described examples are given for the case of the fabrication of a magnetic garnet single crystalline film using the liquid epitaxial growth process. The present invention, however, is not limited to the description in the examples. That is, the effect of the present invention is obtained also in the case of the use of the sputtering process, CVD process, and laser abrasion process.

In Examples 1 to 3, a noise filter is explained as an example of magnetostatic wave device according to one preferred embodiment of the present invention. However, it is appreciated that present invention can be applied to other magnetostatic wave devices, such as a variable filter, a signal-to noise (S/N) enhancer, etc.

What is claimed is:

1. A magnetostatic wave device containing a magnetic garnet single crystalline film having a general formula of $R_{3-x}Ca_xMa_{5-2y+x}Zr_yMb_{y-x}O_{12}$, wherein R is at least one member selected from the group consisting of Y, La, Bi, Gd, Lu and Sc, and Ma is Fe or a combination of Fe and at least one member selected from the group consisting of Ga and Al, and Mb is at least one of Mg and Mn, and wherein the conditions of $0 \leq x < 1$, $0.1 \leq y \leq 1$, and $x<y$ are satisfied.

2. The magnetostatic wave device according to claim 1, in which the magnetic garnet single crystalline film is on a substrate selected from the group consisting of $Gd_3Ga_5O_{12}$, $Sm_3Ga_5O_{12}$ and $Nd_3Ga_5O_{12}$.

3. The magnetostatic wave device according to claim 2, in which x is 0 and the substrate is $Sm_3Ga_5O_{12}$ or $Nd_3Ga_5O_{12}$.

4. The magnetostatic wave device according to claim 2, in which x is 0.05 to 1 and the substrate is $Gd_3Ga_5O_{12}$.

5. The magnetostatic wave device according to claim 1, in which x is 0.

6. The magnetostatic wave device according to claim 1, in which x is 0.05 to 1.

7. The magnetostatic wave device according to claim 1, wherein said film has a saturation magnetization value of 370–1460 G and the device has a magnetostatic surface wave operating frequency of 400–1500 MHz.

8. A material for a magnetostatic wave device comprising a magnetic garnet single crystalline film having a general formula of $R_{3-x}Ca_xMa_{5-2y+x}Zr_yMb_{y-x}O_{12}$, wherein R is at least one member selected from the group consisting of Y, La, Bi, Gd, Lu and Sc, and Ma is Fe or a combination of Fe and at least one selected from the group consisting of Ga and Al, and Mb is at least one of Mg and Mn, and wherein the conditions of $0 \leq x \leq 1$, $0.1 \leq y \leq 1$, and $x<y$ are satisfied.

9. The material according to claim 8, wherein the magnetic garnet single crystalline film is on a substrate selected from the group consisting of $Gd_3Ga_5O_{12}$, $Sm_3Ga_5O_{12}$ and $Nd_3Ga_5O_{12}$.

10. The material according to claim 9, in which x is 0 and the substrate is $Sm_3Ga_5O_{12}$ or $Nd_3Ga_5O_{12}$.

11. The material according to claim 9, in which x is 0.05 to 1 and the substrate is $Gd_3Ga_3O_{12}$.

12. The material according to claim 8, in which x is 0.

13. The material according to claim 8, in which x is 0.05 to 1.

14. The material according to claim 8, in which the film has a saturation magnetization value of 370–1460G.

* * * * *